(12) United States Patent
Fricker et al.

(10) Patent No.: US 11,425,837 B2
(45) Date of Patent: Aug. 23, 2022

(54) SYSTEM FOR SECURELY CONNECTING/DISCONNECTING POWER FOR A MODULE IN A HIGH-POWER MODULAR UNINTERRUPTABLE POWER SUPPLY AND ASSOCIATED INSTALLATION

(71) Applicant: SOCOMEC, Benfeld (FR)

(72) Inventors: Guillaume Fricker, Colmar (FR); Christian Willmann, Huttenheim (FR); Andréa Zinni, Ostwald (FR)

(73) Assignee: SOCOMEC, Benfeld (FR)

( * ) Notice: Subject to any disclaimer, the term of this patent is extended or adjusted under 35 U.S.C. 154(b) by 0 days.

(21) Appl. No.: 17/312,127

(22) PCT Filed: Nov. 19, 2019

(86) PCT No.: PCT/FR2019/052740
§ 371 (c)(1),
(2) Date: Jun. 9, 2021

(87) PCT Pub. No.: WO2020/120851
PCT Pub. Date: Jun. 18, 2020

(65) Prior Publication Data
US 2021/0360815 A1    Nov. 18, 2021

(30) Foreign Application Priority Data

Dec. 11, 2018   (FR) ...................................... 1872670

(51) Int. Cl.
*H05K 7/14*        (2006.01)
(52) U.S. Cl.
CPC ......... *H05K 7/1457* (2013.01); *H05K 7/1492* (2013.01)

(58) Field of Classification Search
None
See application file for complete search history.

(56) References Cited

U.S. PATENT DOCUMENTS 6,222,708 B1   4/2001   Severson et al.
6,392,901 B1   5/2002   Colver et al.
(Continued)

FOREIGN PATENT DOCUMENTS

EP    1022757 A1   7/2000
FR    2744347 A1   8/1997
(Continued)

OTHER PUBLICATIONS

Search Report and Written Opinion from corresponding French Application No. FR1872670, dated Sep. 10, 2019.
(Continued)

*Primary Examiner* — Courtney L Smith
(74) *Attorney, Agent, or Firm* — Workman Nydegger (57) ABSTRACT

A power connection/disconnection system for connecting/disconnecting an electric power module in a high-power modular uninterruptable power supply installation includes: a frame, a rigid support extending along a first direction, a set of connectors mounted on the support and including a ground connector and power connectors. The connectors are successively aligned along the first direction and each shaped to be electrically connected along a second direction orthogonal to the first direction with bars of a power connection box of the installation and a translation device configured to move, using an actuator, the support in the second direction. The ground connector extends higher along the second direction than the power connectors. The ground connector is intended to be electrically connected to a ground bar of the box.

3 Claims, 8 Drawing Sheets

(56) References Cited

U.S. PATENT DOCUMENTS

| | | | |
|---|---|---|---|
| 8,007,301 B2 | 8/2011 | Andersen et al. | |
| 8,027,134 B2* | 9/2011 | Ziegler | H01R 25/003 |
| | | | 361/93.1 |
| 8,546,689 B2 | 10/2013 | Andersen et al. | |
| 9,941,645 B2* | 4/2018 | Morris | H02B 1/36 |
| 10,148,072 B2* | 12/2018 | Dolinski | H02J 9/06 |
| 10,320,162 B2* | 6/2019 | Oneufer | H02B 11/173 |
| 10,666,025 B2* | 5/2020 | Pharne | H02K 5/04 |
| 10,692,665 B2* | 6/2020 | Yee | H02B 11/24 |
| 10,742,004 B2* | 8/2020 | Kroushl | H02B 1/46 |
| 2007/0291433 A1* | 12/2007 | Ziegler | H02B 1/056 |
| | | | 361/93.1 |

FOREIGN PATENT DOCUMENTS

| | | |
|---|---|---|
| FR | 2990620 A1 | 11/2013 |
| GB | 2130021 A | 5/1984 |

OTHER PUBLICATIONS

International Search Report and Written Opinion from PCT Application No. PCT/FR2019/052740, dated Mar. 9, 2020.

* cited by examiner

SYSTEM FOR SECURELY CONNECTING/DISCONNECTING POWER FOR A MODULE IN A HIGH-POWER MODULAR UNINTERRUPTABLE POWER SUPPLY AND ASSOCIATED INSTALLATION

TECHNICAL FIELD

The invention relates to the high-power modular uninterruptable power supply installations, and more particularly to the electrical coupling of a power module of such an installation.

By modular installation, it is meant an installation that allows receiving electrical drawers or modules.

PRIOR ART

The reduction in the downtime of the installation in the case of maintenance or power increase, referred to as "Mean Time To Repair" (MTTR), is a critical parameter in many applications using modular uninterruptable power supply (UPS) installations.

The footprint surface as well as the volume occupied by these modular uninterruptable power supply installations is an important criterion for the users. The power connectors existing on the market generally have dimensions that are still too large.

In addition, the modules configured for the high electric powers have different drawbacks compared to the modules configured for the low electric powers: they are generally bulkier and heavier; they present a risk of electric arcing during high-power connections and disconnections; and the potential risk of electric arcing entails risks for the operator and for the installation.

Some low-power modular uninterruptable power supply installations have a "hot" connection/disconnection system, that is to say a system that allows connecting or disconnecting a module while the installation is powered on. This device allows performing maintenance operations as well as operations of increasing or reducing the power of the installation without interrupting the power supply to the load. As regards low-power installations, the mechanical and electrical stresses are different from those to be considered within the framework of the high-power installations. This difference does not allow using a similar technology.

The known connection/disconnection systems for the high powers generally operate in "cold" mode, that is to say the installation must be powered off before making a connection or a disconnection. These systems operating in "cold" mode therefore have a high MTTR, that is to say they generate a significant downtime of the installation. Furthermore, there is no compact connector available on the market allowing a powered-on disconnection for high powers, in particular for modules higher than 100 kW.

In the state of the art, it is known from document EP 1022757 an electrical connection system whose drawers are not movable and that requires suitable tools to establish the connection and to move the drawer into or out of the housing of the installation.

It is also known from documents FR 2744347 and FR 2990620 mechanical lift systems, from document U.S. Pat. No. 8,007,301 a similar power connection clamp and from document U.S. Pat. No. 8,546,689 a rapid connection of a high-power installation, used in the case of maintenance of the installation.

DISCLOSURE OF THE INVENTION

The invention aims at reducing the MTTR, that is to say the downtime of the installation, from a high-power uninterruptable power supply installation having modular elements such as removable modules, or drawers, and configured to achieve an electrical power and control connection, in complete safety for the operator as well as for the installation, without interrupting the power supply to the load by the installation.

In one object of the invention, there is proposed a power connection/disconnection system for connecting/disconnecting an electric power module in a high-power modular uninterruptable power supply installation, the system comprising:
  a frame,
  a rigid support extending along a first direction,
  a set of connectors mounted on said support and comprising a ground connector intended to be connected to the ground and power connectors intended to supply the module and a load, the connectors being successively aligned along the first direction and each shaped to be electrically connected along a second direction orthogonal to said first direction with ground and power bars of a power connection box of the installation, and
  a device for translating the support configured to move, using an actuator, the support in said second direction.

According to a general characteristic of the invention, the ground connector extends higher, in other words further, along the second direction than the power connectors of the set of connectors of the electric power module, said ground connector being intended to be electrically connected to a ground bar of the power connection box.

In other words, when the set of connectors of the connection/disconnection system is remote from the power and ground bars of the connection box, the distance along the second direction separating the ground connector of the module from the ground bar of the connection box is always smaller than the distance along the second direction separating the power connectors of the module from the power bars of the connection box.

The high-power uninterruptable power supply installation is achieved on the low-power principle, that is to say a "modulable"-type installation. The major difference is the dimension of the modules, their handling, as well as the generated electrical and electromagnetic stresses. The main complexity lies in the "hot" electrical connection system for connecting the module in the installation. The connection/disconnection system according to the invention allows making this electrical power and control connection, in complete safety for the operator as well as for the installation, without interrupting the power supply to the load.

Indeed, the invention allows ensuring that the ground is connected before any other electrical connection is established, and is disconnected after any other electrical connection has been disconnected. This allows improving the security of the installation for the user.

The module is self-supporting, it is equipped with four casters thereby allowing it to be moved without tools. The module is equipped in its upper part with the "hot" connection system.

The translation device is actuated by means of a crank or a motor. The rotational movement generated by the actuator is transformed into translational movement via a worm screw. The translational movement allows raising the support on which the ground connector and the power connectors are located.

According to a first aspect of the power connection/disconnection system, the set of connectors may further comprise a control connector extending in the second direction like the power connectors.

According to a second aspect of the power connection/disconnection system, the translation device may further include a worm screw mechanically coupled to the actuator, at least one assembly formed of a movable carriage mechanically coupled to the worm screw and of a bracing including a first and a second segment assembled together by a pin at the center of each segment, the first segment including a first end secured to the movable carriage and a second end cooperating with the rigid support, the second segment including a first end fixed and secured to the frame and a second end cooperating with the rigid support, and the actuator driving in rotation the worm screw about its axis, the rotation of the worm screw generating a translation of the movable carriage along the first direction towards, or away from, the first end of the second segment, which has the consequence of deploying or folding the bracing and thus moving the rigid support along the second direction.

In another object of the invention, there is proposed a removable electric power module intended to be connected to a high-power modular uninterruptable power supply installation including power bars and a ground bar, the electric power module including electric power members able to supply an electrical load via the power bars of the installation.

According to a general characteristic of the invention, the installation comprises a power connection/disconnection system for connecting/disconnecting an electric power module as defined above.

According to a first aspect of the removable electric power module, the module may further comprise a hatch for accessing said power connection/disconnection system and a sensor for detecting the opening and the closing of said access hatch.

According to a second aspect of the removable electric power module, the module can also comprise a high abutment sensor configured to detect the positioning of the connection/disconnection system in a position in which all the connectors of the connection/disconnection system are connected to the corresponding elements of the connection box of the installation.

In another object of the invention, there is proposed a high-power modular uninterruptable power supply installation comprising a structure defining housings for accommodating removable electric modules, each housing being equipped with means for guiding a removable electric module and with a power connection box.

According to a general characteristic of the invention, the installation comprises at least one removable electric power module as defined above.

According to a first aspect of the high-power modular uninterruptable power supply installation, the electric power module may comprise casters mounted on the module to cooperate with the means for guiding a housing of the installation.

In another object of the invention, there is provided a method for electrically connecting an electric power module in a high-power modular uninterruptable power supply installation as defined above, the installation being powered on.

According to a general characteristic of the invention, the method comprises an actuation of a device for translating a set of connectors successively causing, during the actuation, a connection of a ground connector of the module to a ground bar of the connection box, then a connection of power connectors of the module to the power bars of the connection box.

According to a first aspect of the method for electrically connecting an electric power module, the method can further comprise, during said actuation of the translation device, a connection of a control connector of the module to a control terminal of the connection box, following the connection of the power connectors of the module to the power bars of the connection box.

According to a second aspect of the method for electrically connecting an electric power module, the method can further comprise a detection of end-of-stroke of the translation device, then an emission, by the installation, of a unique identifier to the control unit of the electric module.

According to a third aspect of the method for electrically connecting an electric power module, the actuator can be manually controlled by a user, and the method can further comprise a detection of the opening of a hatch for accessing the connection/disconnection system, the installation delivering to the control unit of the electric module via the control connector a signal preventing the starting of the power members of the electric module as long as the hatch for accessing the connection/disconnection system is open.

According to a fourth aspect of the method for electrically connecting an electric power module, the method may further comprise, following the detection of end-of-stroke of the translation device, a detection of the closing of the hatch for accessing the connection/disconnection system, then a command for a test cycle of the electric module before authorizing a starting of the power supply to the electric module, the test cycle including a check of the value of the input voltage, a check of the connections of the sensors, a check of the quality of the communication with the other electric modules of the installation.

According to a fifth aspect of the method for electrically connecting an electric power module, the method may further comprise a command to close a contactor in order to start the power members and a command to connect the power members to the power connectors according to the result of the test cycle.

In another object of the invention, there is proposed a method for electrically disconnecting an electric power module in a high-power modular uninterruptable power supply installation as defined above, the installation being powered on.

According to a general characteristic of the invention, the method comprises an actuation of a connector translation device causing successively, during the actuation, a disconnection of the power connectors from the installation with the power bars of the electric module, then a disconnection of a ground connector from the installation with a ground bar of the connection box.

According to a first aspect of the method for electrically disconnecting an electric power module, the method may further comprise, before the actuation of the translation device, a detection of an opening of the hatch for accessing the connection/disconnection system followed by a command to stop the power members and a command to disconnect the power members from the power connectors of the electric module by the opening of a contactor.

BRIEF DESCRIPTION OF THE DRAWINGS

The invention will be better understood upon reading the following, by way of indication but without limitation, with reference to the appended drawings in which:

FIG. 9 presents a flowchart of a method for electrically connecting an electric power module in a high-power modular uninterruptable power supply installation which is powered on.

FIG. 10 presents a flowchart of a method for electrically disconnecting an electric power module in a high-power modular uninterruptable power supply installation which is powered on.

DESCRIPTION OF THE EMBODIMENTS

Figure 1:
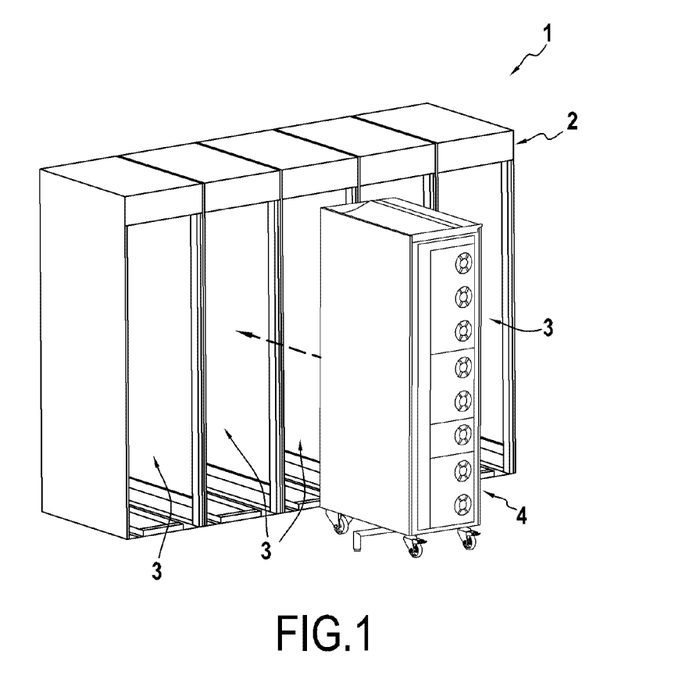
FIG. 1 represents a schematic perspective view of a high-power modular uninterruptable power supply installation according to one embodiment of the invention.

FIG. 1 illustrates a high-power modular uninterruptable power supply installation according to one embodiment of the invention.

The modular uninterruptable power supply installation 1 comprises a rack 2 defining a plurality of housings 3 configured to receive removable electric power modules 4.

Figure 2:
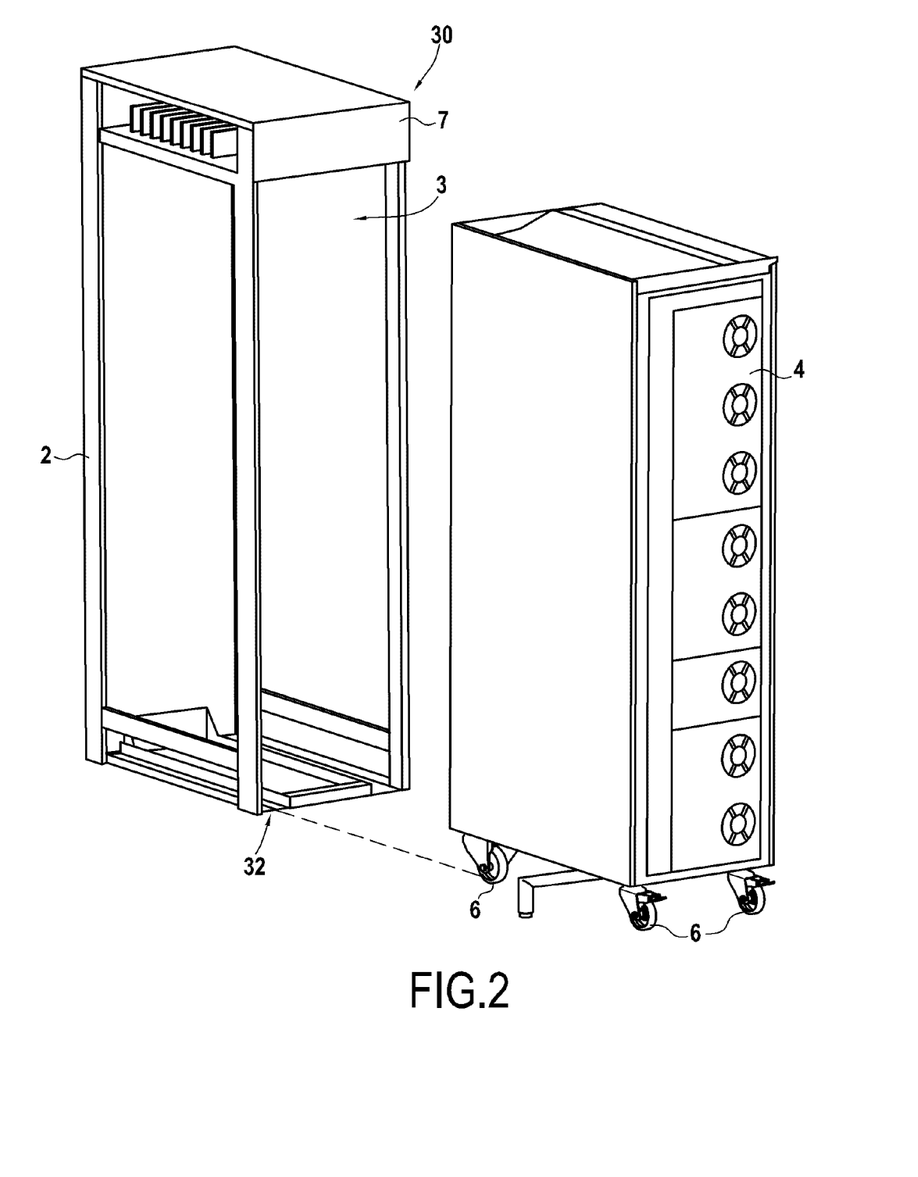
FIG. 2 illustrates a housing and an electric power module of the modular installation of FIG. 1.

FIG. 2 illustrates part of the installation 1 of FIG. 1 illustrating in particular a housing 3 as well as an electric power module 4 including electric power members.

The module 4 comprises a chassis 5 mounted on casters 6 that allow moving the module 4 and in particular inserting it into the housing 3 or extracting it therefrom more easily.

For each accommodation housing 3, the rack 2 comprises uprights 20 extending along the height of the rack 2 and cross-members 22 extending in a plane orthogonal to the uprights 20. The height of the rack 2 extends in a direction orthogonal to a plane on which the casters 6 of the module 4 are intended to rest. Each housing 3 has an upper end 30 and a lower end 32 intended to be in contact with the floor on which the rack 2 rests. The rack 2 comprises, for each housing 3, an electrical connection box 7 disposed at the upper end 30 of the housing 3. Each module 4 is intended to be inserted into a space defined between the uprights 20 of a housing 3 and between the lower end 32 and the connection box 7 of the housing 3.

Figure 3:
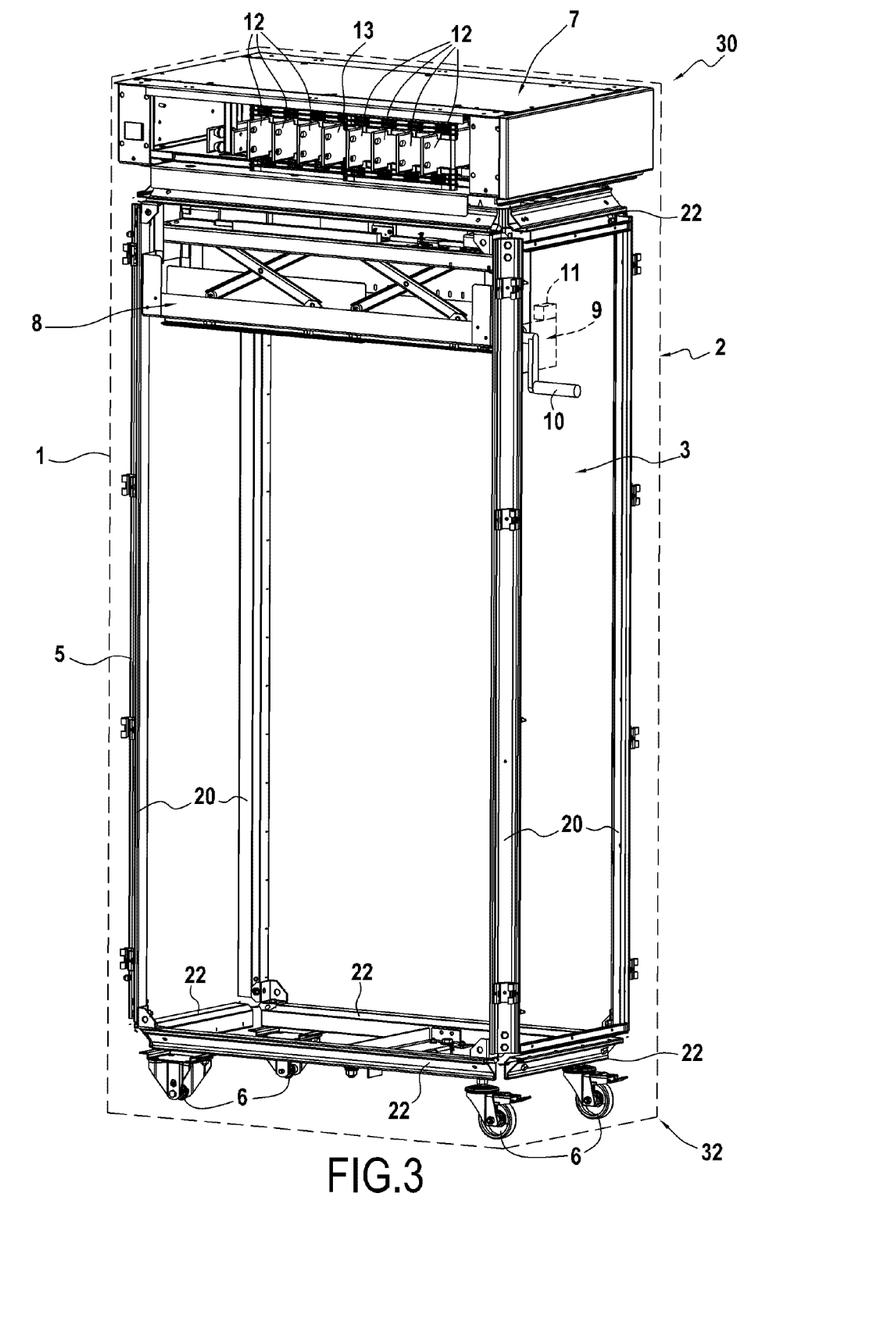
FIG. 3 illustrates an electric power module inserted into a housing of the installation of FIG. 1.

As illustrated in FIG. 3 which illustrates an electric power module 4 inserted into a housing 3 of the installation 1, each module 4 is equipped with an electric power connection/disconnection system 8 configured to electrically connect or disconnect the module 4 to/from the connection box 7 of the housing 3 of the installation 1 into which it is inserted.

Each module 4 of the installation 1 comprises a hatch 9 for accessing the electric power connection/disconnection system that allows introducing a crank 10 into an orifice formed in the connection/disconnection system and shaped to cooperate with the crank 10. The module 4 of the installation 1 further comprises a sensor 11 for detecting the opening and the closing of the access hatch 9.

The electrical power connection box 7 includes power bars 12 intended to be connected to the electric power members of the electric power module 4, and a bar of the ground 13 intended to connect the ground of the electric power module 4 to the ground.

Figure 4:
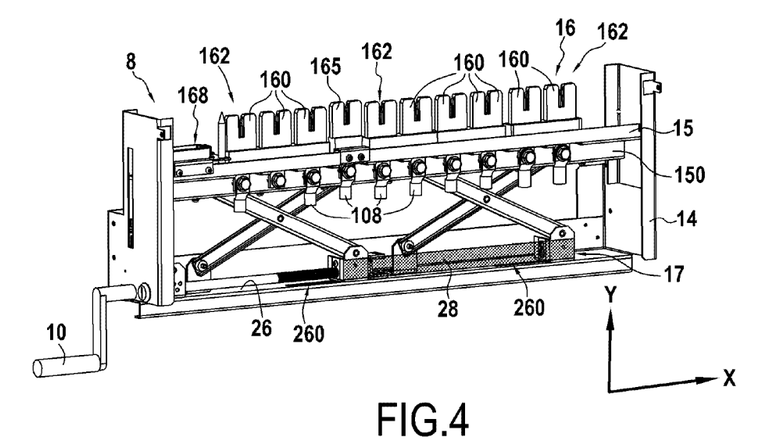
FIG. 4 presents schematically a perspective view of the electric power connection/disconnection system of the installation of FIG. 1.

FIG. 4 schematically represents a perspective view of the electric power connection/disconnection system 8 of the installation 1 of FIG. 1.

The connection/disconnection system 8 comprises a frame 14, a rigid support 15, a set of connectors 16 and a device for translating 17 the rigid support 15.

The set of connectors 16 is disposed on an upper portion of the module 4 to be positioned facing the connection box 7 when the module is inserted into a housing 3. The set of connectors 16 comprises power connectors 160 intended to be connected to the power bars 12 of the connection box 7 to supply the module 4 and the load, a ground connector 165 intended to be connected to the ground bar 13, and a control connector 168.

The rigid support 15 extends along a first direction X and the connectors 160 and 165 of the set of connectors 16 are mounted along this first direction X on the support 15. Each connector 160 and 165 comprises a slot 162 intended to receive an electrical connection bar 12 or 13 of the electrical power connection box 7 to achieve the different electrical connections. Each connector 160 and 165 thus forms an electrical connection clamp which is linked to a lug 108 intended to receive an electrical cable.

Figure 5:
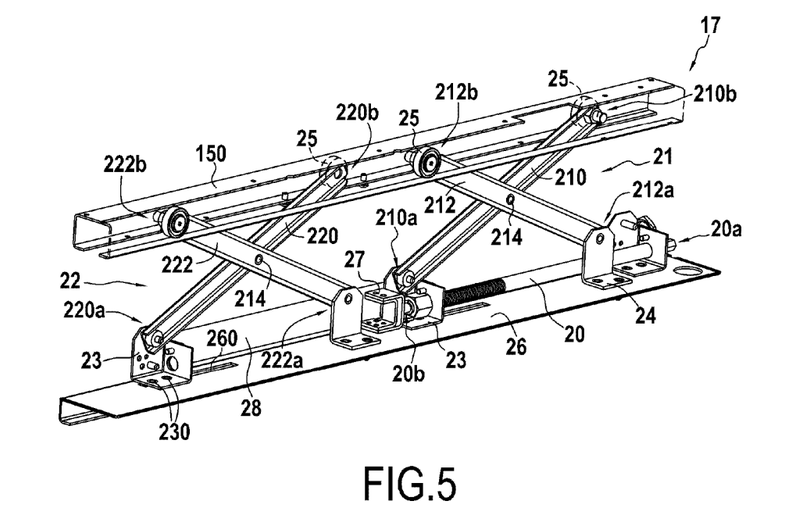
FIG. 5 represents a perspective view of the device for translating the support of the connection/disconnection system of FIG. 2.

FIG. 5 presents a perspective view of the device for translating 17 the support 15 of the connection/disconnection system 7 of FIG. 4.

The translation device 17 is configured to move the support 15 in a second direction Y which is orthogonal to the first direction X and parallel to the direction along which the ground and power connectors 165 and 160 are assembled with the ground bar 13 and the power bars 12 to achieve the different electrical connections.

The translation device 17 comprises the crank 10, a worm screw 20, a first bracing 21 and a second bracing 22, and a first and a second movable carriage 23.

The worm screw 20 comprises a first end 20a and a second end 20b. The first end 20a of the worm screw 20 is mechanically coupled to the crank 10. The crank 10 comprises one end which is inserted into an orifice of the frame 14 of the connection/disconnection system 8 to fit onto the first end 20a of the worm screw 20. The first end 20a of the worm screw 20 has, in the example illustrated in FIG. 5, a hexagonal section intended to cooperate with the end of the crank 10 which has a hollow cylindrical section with a hexagonal base which allows the crank to drive in rotation the worm screw 20.

The first bracing 21 includes a first segment 210 and a second segment 212 assembled together by a pin 214 at the center of each segment 210 and 212. The first segment 210 of the first bracing 21 includes a first end 210a secured to the first movable carriage 23 and a second end 210b cooperating with the rigid support 15. The second segment 212 of the first bracing 21 includes a first end 212a fixed to the frame 14 by means of a corner piece 24 and a second end 212b cooperating with the rigid support 15. The second end 210b of the first segment 210 and the second end 212b of the second segment 212 of the first bracing 21 each comprise a caster 25 intended to move in a slide of a profile 150 of the rigid support 15.

The profile 150 of the rigid support has a rectangular section, in a sectional plane orthogonal to the first direction X, partially open on one side, the side facing the worm screw 20, thus forming two slides, or rails, facing each other. Each segment 210 and 212 of the first bracing 21 has a first face and a second face opposite to the first face. The first face of the first segment 210 is oriented towards the second segment 212 and the first face of the second segment 212 is oriented towards the first segment 210. The casters 25 of the first bracing 21 are fixed on the second face of the first and second segments 210 and 212.

The first bracing 21 is inserted into the profile 150 of the support 15 through the opening of the profile 150, and each of the two casters 25 moves in one of the two slides of the profile 150.

The second bracing 22 includes a first segment 220 and a second segment 222 assembled together by a pin 214 at the center of each segment 220 and 222. The first segment 220 of the second bracing 22 includes a first end 220a secured to the second movable carriage 23 and a second end 220b cooperating with the rigid support 15. The second segment 222 of the second bracing 22 includes a first end 222a fixed to the frame 14 by means of a corner piece 24 and a second end 222b cooperating with the rigid support 15. The second end 220b of the first segment 220 and the second end 222b of the second segment 222 of the second bracing 22 each comprise a caster 25 intended to move in a slide of a profile 150 of the rigid support 15.

Each segment 220 and 222 of the second bracing 22 has a first face and a second face opposite to the first face. The first face of the first segment 220 is oriented towards the second segment 222 and the first face of the second segment 222 is oriented towards the first segment 220. The casters 25 of the second bracing 21 are fixed on the second face of the first and second segments 220 and 222.

The second bracing 22 is inserted into the profile 150 of the support 15 through the opening of the profile 150, and each of the two casters 25 moves in one of the two slides of the profile 150.

The support 15 translation device 17 comprises a plate 26 on which the corner pieces 24 of the two bracings 21 and 22 are fixed. This plate 26 comprises two guide slots 260 each cooperating with one of the first and second movable carriages 23 to allow a translation of the movable carriages 23 along the first direction X, the movable carriages 23 each comprising a guide pin 230 sliding inside the guide slot 260.

The translation device further comprises a securing plate 28 on which the movable carriages 23 are fixed so that the displacement of a movable carriage 23, in particular the movable carriage cooperating with the worm screw 20, causes the displacement of the other movable carriage 23, which thus allows the two bracings 21 and 22 to be driven by the same translational movement simultaneously. The securing plate 28 extends in a plane parallel to the plane in which extends the plate 26 on which the corner pieces 24 are fixed, but without having contact with said plate 26.

The support 15 translation device 17 further comprises an abutment 27 fixed on the plate 26 and disposed between the two bracings 21 and 22. The second end 20b of the worm screw 20 is fixed to the abutment 27 in free rotation so as to be able to rotate about its axis X' without moving in the first or the second direction X, Y. The first movable carriage 23 of the first bracing 21 bears against the abutment 27 at the end-of-stroke.

The crank 10 drives in rotation the worm screw 20 about its axis X'. The rotation of the worm screw 20 generates a translation of the first movable carriage 23 along the first direction X towards, or away from, the first end 212a of the second segment 212 of the first bracing, which has the consequence of deploying or folding the bracing 21 and thus moving the rigid support 15 along the second direction Y.

The securing plate 28 fixed on the two movable carriages 23 allows the simultaneous displacement of the two carriages 23 and therefore the raising or the lowering of the rigid support 15 by the bracings 21 and 22.

As illustrated in FIG. 3, the ground connector 165 extends higher along the second direction Y than the power connectors 160 of the set of connectors 16, so that the ground is always connected before the power connectors 160 and disconnected after the power connectors 160.

Each module 4 also comprises a high abutment sensor to detect the arrival at the end-of-stroke of the connection/disconnection system 8.

Figure 6:
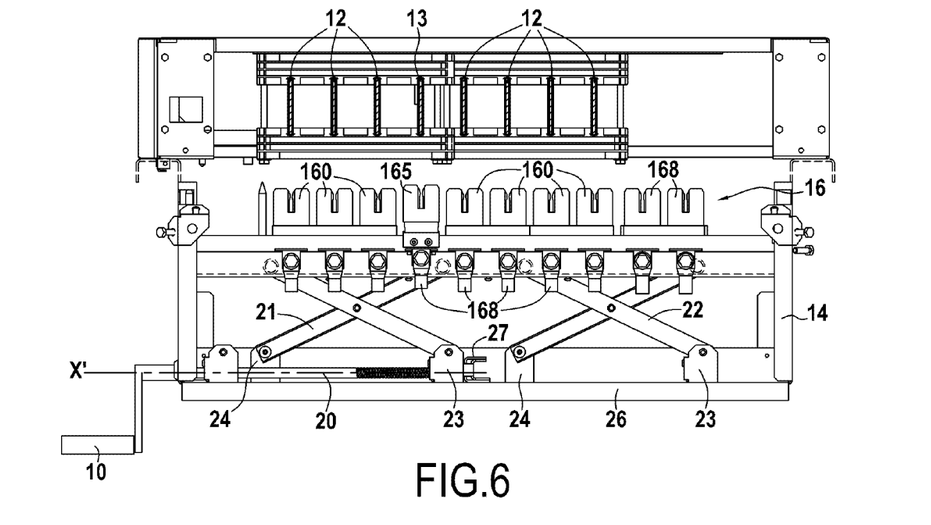
FIG. 6 presents a view of the connection/disconnection system and of the electric power module of the installation of FIG. 1 at an electrical disconnection position.
Figure 7:
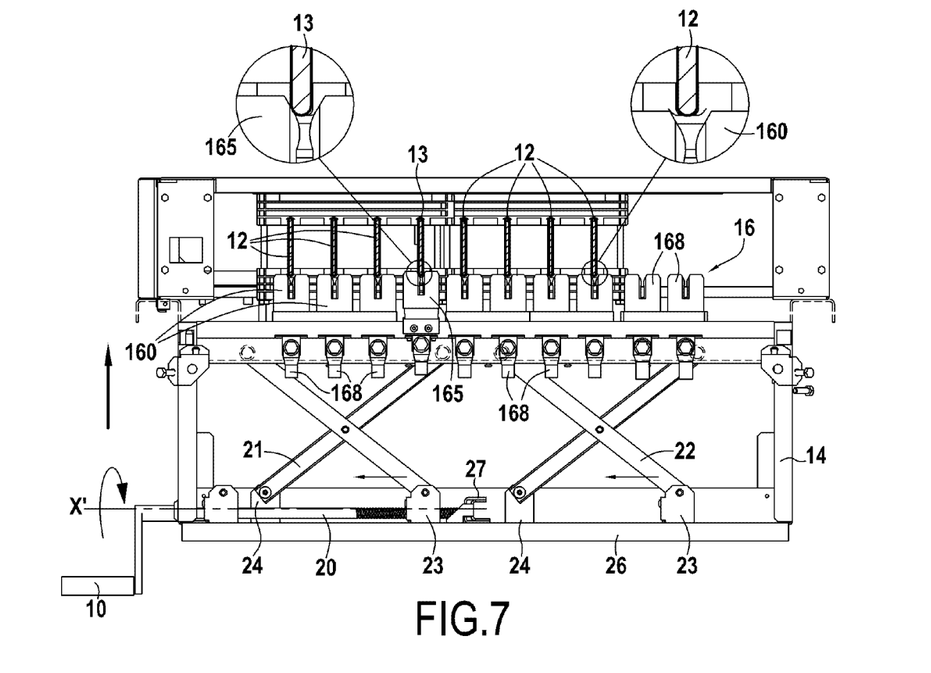
FIG. 7 presents a view of the connection/disconnection system and of the electric power module of the installation of FIG. 1 at a halfway position where only the ground is connected.
Figure 8:
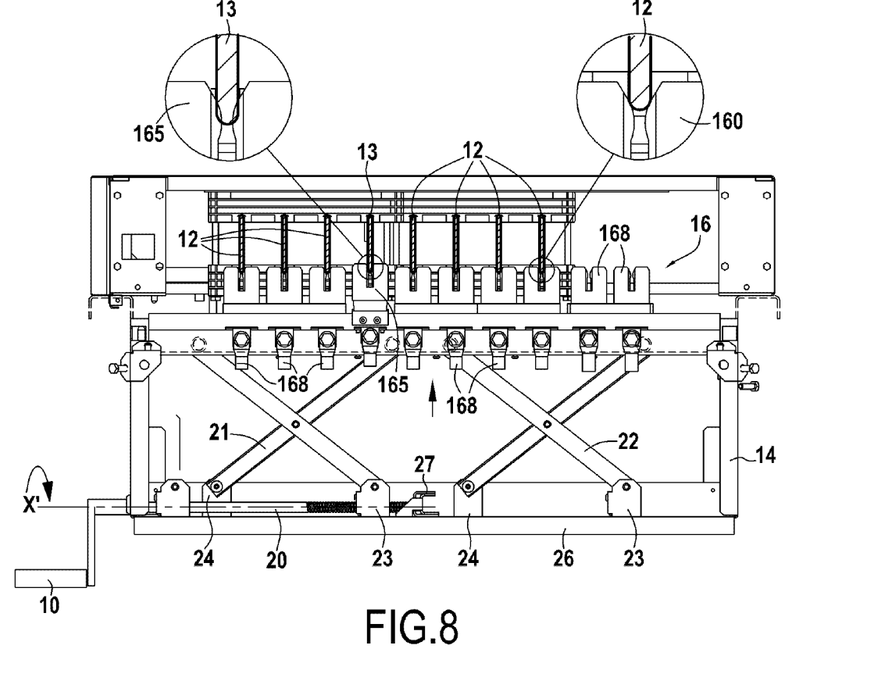
FIG. 8 presents a view of the connection/disconnection system and of the electric power module of the installation of FIG. 1 at an electrical connection position.

FIGS. 6 to 8 represent three views of the connection/disconnection system 8 and of the electrical power connection box 7 of the installation 1 of FIG. 3 respectively at an electrical disconnection position (FIG. 6), a halfway position where only the ground is connected (FIG. 7) and an electrical connection position (FIG. 8).

Figure 9:
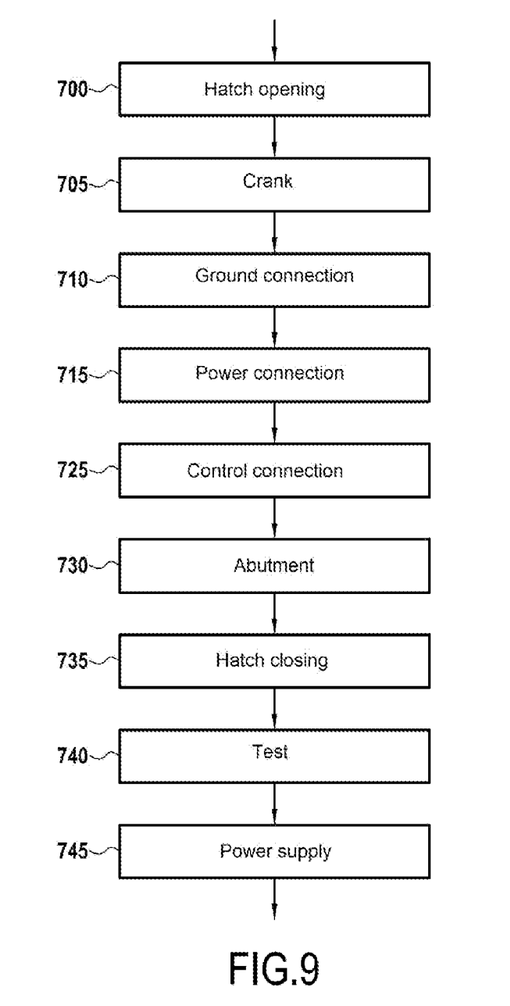

And FIG. 9 presents a flowchart of a method for electrically connecting an electric power module 4 in a powered-on modular accommodation housing 3 of a high-power modular uninterruptable power supply installations 1.

Following an insertion of a removable power module 4 in a housing for accommodating 3 the installation 1, in a first step 700 of the method, the hatch 9 for accessing the connection/disconnection system 8 is opened and the opening of the hatch 9 is detected by the dedicated sensor 11 which continuously delivers a signal preventing the starting of the power members of the module 4 as long as the hatch 9 for accessing the actuator is open. The signal will be delivered to an electronic control unit of the module 4 when the control connector 168 will be connected to a control terminal of the connection box 7 of the housing 3.

In a following step 705, the crank 10 is connected to the first end 20a of the worm screw 20, and the translation device 17 is actuated by turning the crank 10. As illustrated in FIG. 5, the rotation of the worm screw 20 via the crank 10 causes the displacement of the first movable carriage 23 and of the second movable carriage 23 via the securing plate 28 in the first direction X respectively towards the corner piece 24 of the first bracing 21 and respectively towards the corner piece 24 of the second bracing 22 which deploys the bracings 21 and 22 and thus moves the rigid support 15 in the second direction Y.

The raising of the rigid support 15 towards the power connection box 7 will cause, in a step 710, first of all the connection of the ground connector 165 to the ground bar 13 as illustrated in FIG. 7. In this position, only the ground is connected, the power connectors 160 still being distant from the power bars 12.

By continuing to turn the crank 10, the translation device 17 continues the deployment of the bracings 21 and 22 which allows, in a following step 715, simultaneously connecting all the power connectors 160 to the power bars 12 of the connection box 7 as illustrated in FIG. 8.

In a next step 725, by continuing to turn the crank 10, the translation device 17 continues the deployment of the bracings 21 and 22 which allows connecting the control connector 168 to the control connector of the connection box 7 of the housing 3 no represented in FIGS. 4 and 6.

In a next step 730, the rigid support 15 abuts in the high position and an end-of-stroke of the translation device 17 is detected using an end-of-stroke sensor which emits a unique identifier of the installation 1 to the electronic control unit of the electric power module 4.

In a next step 735, the crank 10 is removed and the hatch 9 for accessing the connection/disconnection system 8 is closed. The sensor 11 for detecting the opening and closing of the access hatch 9 then delivers to the electronic control unit a signal to close the access hatch 9.

In a following step 740, a test cycle of the electric module 4 is launched. The test phase comprises an identification of the card on the communication bus, a check of the versions of the software, a check of the parameters, a check of the voltages, a check of the end-of-stroke contacts, a starting of the pre-charge of the chemical capacitors, a starting of the inverter in double conversion, and a closing of the contactor supplying the load.

In a next step 745, the load is supplied by the module 4 through the power bars 12 of the connection box 7 of the housing 3 of the installation 1.

Figure 10:
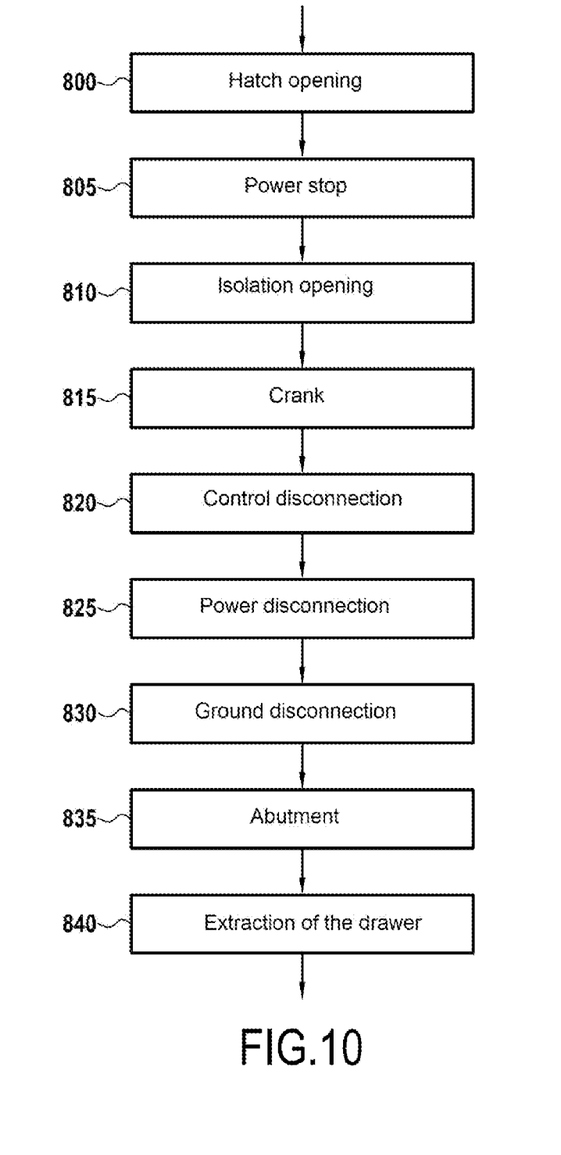

FIG. 10 presents a flowchart of a method for electrically disconnecting an electric power module 4 in a high-power modular uninterruptable power supply installation 1 which is powered on.

In a first step 800 of the disconnection method, the access hatch 9 is opened and the opening of the access hatch 9 is detected using the dedicated sensor 11.

In second step 805 of the disconnection method, a shutdown of the power members of the electric module 4 is ordered.

In a third step 810, the opening of the output isolation member and of the input isolation member of the electric module 4 is ordered.

In a fourth step 815, the connection/disconnection system 8 is actuated by means of the crank 10, which allows, in a fifth step 820, electrically decoupling the control connector 168 of the module 4 from the control terminal of the connection box 7 of the housing 3, then, in a sixth step 825, disconnecting the power connectors 160 from the power bars 12, then, in a seventh step 830, following the sixth step 825, decoupling the ground connector 165 from the ground bar 13.

In an eighth step 835, the translation device 17 comes into low abutment of the frame 14 of the connection/disconnection system 8, and then, in a ninth step 840, the removable electric power module 4 is extracted from the installation 1.

The invention allows cancelling the downtime of a high-power uninterruptable power supply installation having modular elements such as removable modules, that is to say an installation comprising "modules", and configured to achieve an electrical power and control connection, in complete safety for the operator as well as for the installation, without interrupting the power supply to the load by the installation.

The invention claimed is:

1. A power connection/disconnection system of an electric power module for connecting/disconnecting the electric power module in a high-power modular uninterruptable power supply installation, the system comprising:
    a frame,
    a rigid support extending along a first direction,
    a set of connectors mounted on said support and comprising a ground connector and power connectors intended to supply the electric power module with an electrical load, the set of connectors being successively aligned along the first direction and each shaped to be electrically connected along a second direction orthogonal to said first direction with ground and power bars of a power connection box of the installation, and
    a device for translating the support configured to move, using an actuator, the support in said second direction,
    wherein the ground connector extends higher along the second direction than the power connectors of the set of connectors of the connection/disconnection system, said ground connector being intended to be electrically connected to the ground bar of the power connection box.

2. The system according to claim 1, wherein the set of connectors further comprises a control connector extending in the second direction like the power connectors.

3. The system according to claim 1, wherein the translation device further includes a worm screw mechanically coupled to the actuator,
    an assembly formed of a movable carriage mechanically coupled to the worm screw and of a bracing including a first and a second segment assembled together by a pin at a center of each segment,
    the first segment including a first end secured to the movable carriage and a second end cooperating with the rigid support,
    the second segment including a first end fixed and secured to the frame and a second end cooperating with the rigid support, and
    the actuator driving in rotation the worm screw about its axis, the rotation of the worm screw generating a translation of the movable carriage along the first direction towards, or away from, the first end of the second segment, which has a consequence of deploying or folding the bracing and moving the rigid support along the second direction.

* * * * *